US006917662B2

(12) United States Patent
Austin et al.

(10) Patent No.: US 6,917,662 B2
(45) Date of Patent: Jul. 12, 2005

(54) PROGRAMMABLE LOW-POWER HIGH-FREQUENCY DIVIDER

(75) Inventors: John S. Austin, Winooski, VT (US); Ram Kelkar, South Burlington, VT (US); Pradeep Thiagarajan, South Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/661,050

(22) Filed: Sep. 11, 2003

(65) Prior Publication Data

US 2005/0057285 A1 Mar. 17, 2005

(51) Int. Cl.[7] .............................................. H03K 21/00
(52) U.S. Cl. ..................... 377/47; 327/115; 327/228; 327/230
(58) Field of Search ................................ 327/115, 228, 327/230; 377/47

(56) References Cited

U.S. PATENT DOCUMENTS 6,744,289 B2 * 6/2004 Nguyen et al. ............. 327/115

* cited by examiner

Primary Examiner—Margaret R. Wambach
(74) Attorney, Agent, or Firm—Schmeiser, Olsen & Watts; William H. Steinberg

(57) ABSTRACT

A fast latch including: a NAND stage adapted to receive a clock signal and a data input signal; a clocked inverter stage, a first input of the clocked inverter stage coupled to the output of the NAND stage and a second input of the clocked inverter stage coupled to the clock signal; a first inverter stage, a first input of the first inverter stage coupled to an output of the clocked inverter and a second input of the first inverter stage coupled to a reset signal; and a second inverter stage, having an output, an input of the second inverter stage coupled to an output of the first inverter stage. The fast latch is suitable for use in frequency divider circuits also described. A homologue of frequency dividers using the fast latch, a unique 3/4 divider and a 2 divider not using the fast latch are also disclosed.

16 Claims, 10 Drawing Sheets

PROGRAMMABLE LOW-POWER HIGH-FREQUENCY DIVIDER

FIELD OF THE INVENTION

The present invention relates to the field of integrated circuits; more specifically, it relates to programmable high-frequency divider circuit with low power consumption.

BACKGROUND OF THE INVENTION

Computer systems employ data input, storage, processing and output integrated circuits. In order to assure proper operation of these circuits, they often need to be time-domain synchronized. In order to provide such synchronization, computer systems typically employ clock circuits for synchronizing the data transfer and process timing of these circuits. Synchronization of these circuits in modern high-performance and low-power computers requires several clock signals of varying frequency that themselves must be synchronized to one another. It is not a trivial undertaking to design such clock circuits that operate at multiple frequencies, with high-speed and with low power consumption.

SUMMARY OF THE INVENTION

A first aspect of the present invention is a fast latch comprising: a NAND stage adapted to receive a clock signal and a data input signal; a clocked inverter stage, a first input of the clocked inverter stage coupled to the output of the NAND stage and a second input of the clocked inverter stage coupled to the clock signal; a first inverter stage, a first input of the first inverter stage coupled to an output of the clocked inverter and a second input of the first inverter stage coupled to a reset signal; and a second inverter stage, having an output, an input of the second inverter stage coupled to an output of the first inverter stage.

A second aspect of the present invention is a frequency divider generating an output clock signal, comprising: a one-shot generator, an input of the one-shot generator coupled to an input clock signal and an output of the one shot generator coupled to clock inputs of at least two latches, the latches arranged as a shift register, a data output of a previous latch of the shift register coupled to a data input of a following latch of the shift register and a data output of a last latch of the shift register coupled to a data input of a first latch of the shift register; an output of the frequency divider coupled to the output of a next to last latch of the shift register; and wherein, the frequency of the output clock signal is a function of the frequency of the input clock signal and the number of the latches.

A third aspect of the present invention is a programmable frequency divider, comprising: a multiplicity of frequency dividers each generating a different output clock signal, each comprising: a one-shot generator, an input of the one-shot generator coupled to an input clock signal and an output of the one shot generator coupled to clock inputs of at least two latches, the latches arranged as a shift register, a data output of a previous latch of the shift register coupled to a data input of a following latch of the shift register and a data output of a last latch of the shift register coupled to a data input of a first latch of the shift register; an output of the frequency divider coupled to the output of a next to last latch of the shift register; and wherein, the frequency of each output clock signal is a function of the frequency of the input clock signal and the number of the latches in each frequency divider; wherein the number of latches in each frequency divider is different; means for generating a different reset signal for each frequency divider; and means for selecting and coupling one the output clock signal of one the frequency divider to a clock output of the programmable divider.

A fourth aspect of the present invention is a divide by 2 frequency divider comprising: identical first set and second sets of cascaded of FETs, each set adapted to receive an input clock signal and an inverted version of the input clock signal; and a first inverter, the gate of a PFET of the first inverter coupled to an output of the first set of cascaded FETs, the gate of an NFET of the first inverter coupled to an output of the second set of cascaded FETs, an output of the first inverter coupled to an output of the frequency divider and to inputs of the first and second sets of cascaded FETs.

BRIEF DESCRIPTION OF DRAWINGS

The features of the invention are set forth in the appended claims. The invention itself, however, will be best understood by reference to the following detailed description of an illustrative embodiment when read in conjunction with the accompanying drawings, wherein:

DETAILED DESCRIPTION OF THE INVENTION

Figure 8:
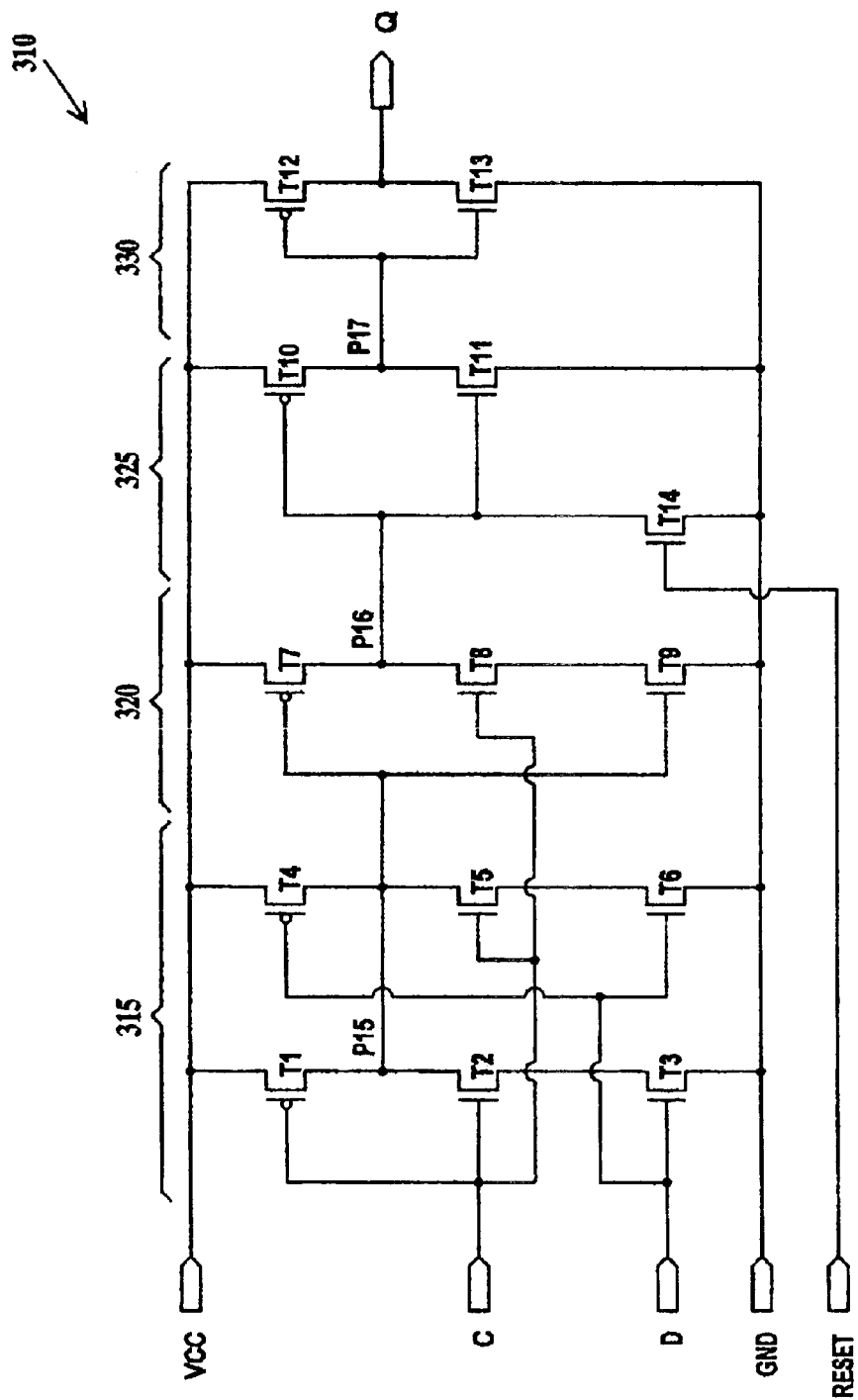
FIG. 8 is a schematic diagram of a fast latch according to the present invention.

Unless otherwise noted it should be understood that when a signal is described as divided by a number, it is meant that the frequency of the signal is divided by that number. The present invention utilizes a unique circuit for dividing frequencies by two, two different types of circuits for dividing frequencies by three or four and a homologous set of circuits for frequency division above two (the second type of circuit for dividing by three or four is the lowest member of this set of homologous circuits). Unless otherwise stated a signal described as low or zero (0) is a logical 0 and a signal described as a high or one (1) is a logical 1. Transitions from 1 to 0 (high to low) or 0 to 1 (low to high) are similarly defined as logical transitions. The term fast latch refers to a novel latch of the present invention. The fast latch of the present invention has low power consumption and very fast latching speed and is illustrated in FIG. 8 and described infra.

Figure 1:
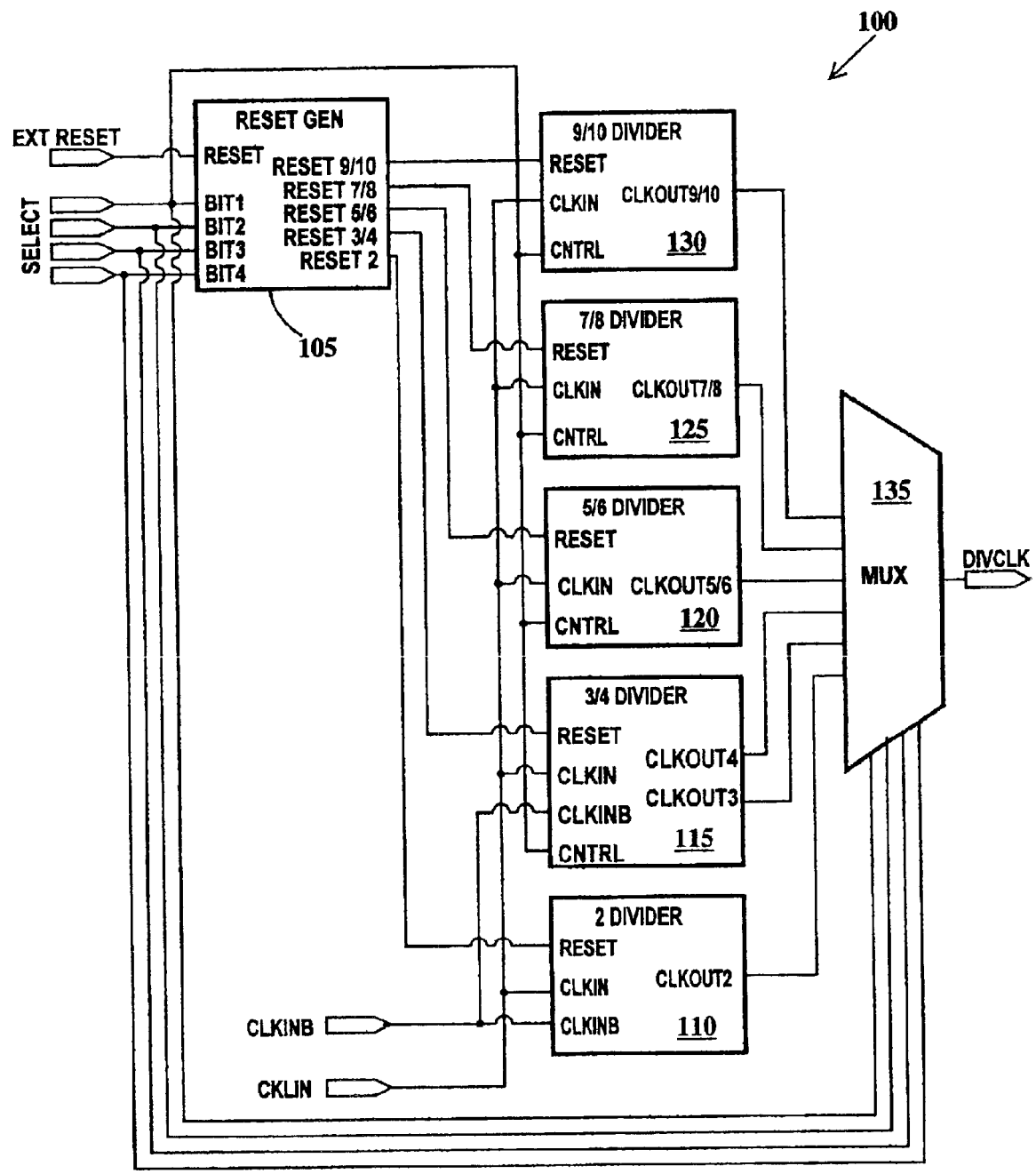
FIG. 1 is a schematic diagram of an exemplary programmable frequency divider according to the present invention.

FIG. 1 is a schematic diagram of an exemplary programmable frequency divider according to the present invention. A frequency divide circuit produces an output clock signal numerically equal to the frequency of an input clock signal divided by a fixed number, often a whole positive integer. In FIG. 1, a programmable frequency divider circuit 100 for outputting an output clock signal DIVCLK based on inputted clock signals CLKIN and CLKINB includes a reset generator 105, a divide frequency by two circuit (2divider) 110, a divide frequency by three or four circuit (3/4divider) 115, divide frequency by five or six circuit (5/6 divider) 120, a divide frequency by seven or eight circuit (7/8divider) 125, a divide frequency by nine or ten circuit (9/10divider) 130 and an inverting multiplexer 135. The number of frequency divider circuits is exemplary and more or less may be used and the numerical division of frequency may be changed as well. The notation CLKINB denotes the complement of CLKIN.

Reset generator 105 is coupled to an external reset signal EXT RESET for resetting the state of programmable frequency divider circuit 100 and a four-bit SELECT signal (having bits BIT1, BIT2, BIT3 and BIT4) for selecting the divide value that the frequency of CLKIN is to be divided by. Reset generator 105 generates a RESET2 signal coupled to a RESET input of 2 divider 110, a RESET3/4 signal coupled to a RESET input of 3/4 divider 115, a RESET5/6 signal coupled to a RESET input of 5/6 divider 120, a RESET7/8 signal coupled to a RESET input of 7/8 divider 125 and a RESET9/10 signal coupled to a RESET input of 9/10 divider 130. CLKIN is coupled to respective CLKIN inputs of 2 divider 110, 3/4 divider 115, 5/6 divider 120, 7/8 divider 125 and 9/10 divider 130. CLKINB is coupled to respective CLKINB inputs of 2 divider 110 and 3/4 divider 115 (when 3/4 divider 115 is of the type illustrated in FIG. 2A and described infra). There is no CLKINB input to 3/4 divider 115 is of the type illustrated in FIG. 2B and described infra. BIT1 of SELECT is coupled to respective CNTRL inputs of 3/4 divider 115, 5/6 divider 120, 7/8 divider 125 and 9/10 divider 130. The function of the EXT RESET signal is described infra.

A CLKOUT2 signal from 2 divider 110 is coupled to a first input of inverting multiplexer 135. CLKOUT2 has a frequency of half that of CLKIN. CLKOUT3 signal from 3/4 divider 115 is coupled to a second input of inverting multiplexer 135 and a CLKOUT4 signal from 3/4 divider 115 is coupled to a third input of inverting multiplexer 135. CLKOUT3 has a frequency of one third and CLKOUT4 has a frequency of one quarter the frequency of CLKIN. A CLKOUT5/6 signal from 5/6 divider 120 is coupled to a fourth input of inverting multiplexer 135. CLKOUT5/6 has a frequency of one fifth or one sixth that of CLKIN depending on whether BIT1 is a one or a zero. A CLKOUT7/8 signal from 7/8 divider 125 is coupled to a fifth input of inverting multiplexer 135. CLKOUT7/8 has a frequency of one seventh or one eighth that of CLKIN depending on whether BIT1 is a one or a zero. A CLKOUT9/10 signal from 9/10 divider 130 is coupled to a sixth input of inverting multiplexer 135. CLKOUT9/10 has a frequency of one ninth or one tenth that of CLKIN depending on whether BIT1 is a one or a zero.

Switching inputs of inverting multiplexer 135 are coupled to the SELECT signal. The output of inverting multiplexer 135, DIVCLK is either CLKOUT2, CLKOUT3, CLKOUT4, CLKOUT5/6, CLKOU7/8 or CLKOUT 9/10 based on the value of the bits in the SELECT signal. BIT1 also determines whether CLKOUT 5/6 is CLKIN divided by 5 or CLKIN divided by 6, whether CLKOUT7/8 is CLKIN divided by 7 or CLKIN divided by 8 and whether CLKOUT9/10 is CLKIN divided by 9 or CLKIN divided by 10. It should be understood that the output of 3/4 divider 115 is CLKOUT3 and CLKOUT4 when 3/4 divider 115 is of the first type, but the output of 3/4 divider 115 its output is a CLKOUT3/4 signal when 3/4 divider 115 is of the second type.

In one example, CLKIN has a frequency of about 4200 MHz or less and programmable frequency divider circuit 100 runs using a supply voltage (VCC) as low as about 1.15 volts. TABLE I illustrates the value of the frequency of DIVCLK as a function of the value of the frequency of CLKIN based on the values of the bits in the SELECT signal.

TABLE I

| BIT1 | BIT2 | BIT3 | BIT4 | DIVCLK |
|------|------|------|------|--------|
| 0 | 1 | 1 | 0 | CLKIN/2 |
| 1 | 0 | 1 | 0 | CLKIN/3 |
| 0 | 0 | 1 | 0 | CLKIN/4 |
| 1 | 1 | 0 | 0 | CLKIN/5 |
| 0 | 1 | 0 | 0 | CLKIN/6 |
| 1 | 0 | 0 | 0 | CLKIN/7 |
| 0 | 0 | 0 | 0 | CLKIN/8 |
| 1 | 0 | 0 | 1 | CLKIN/9 |
| 0 | 0 | 0 | 1 | CLKIN/10 |

Figure 2A:
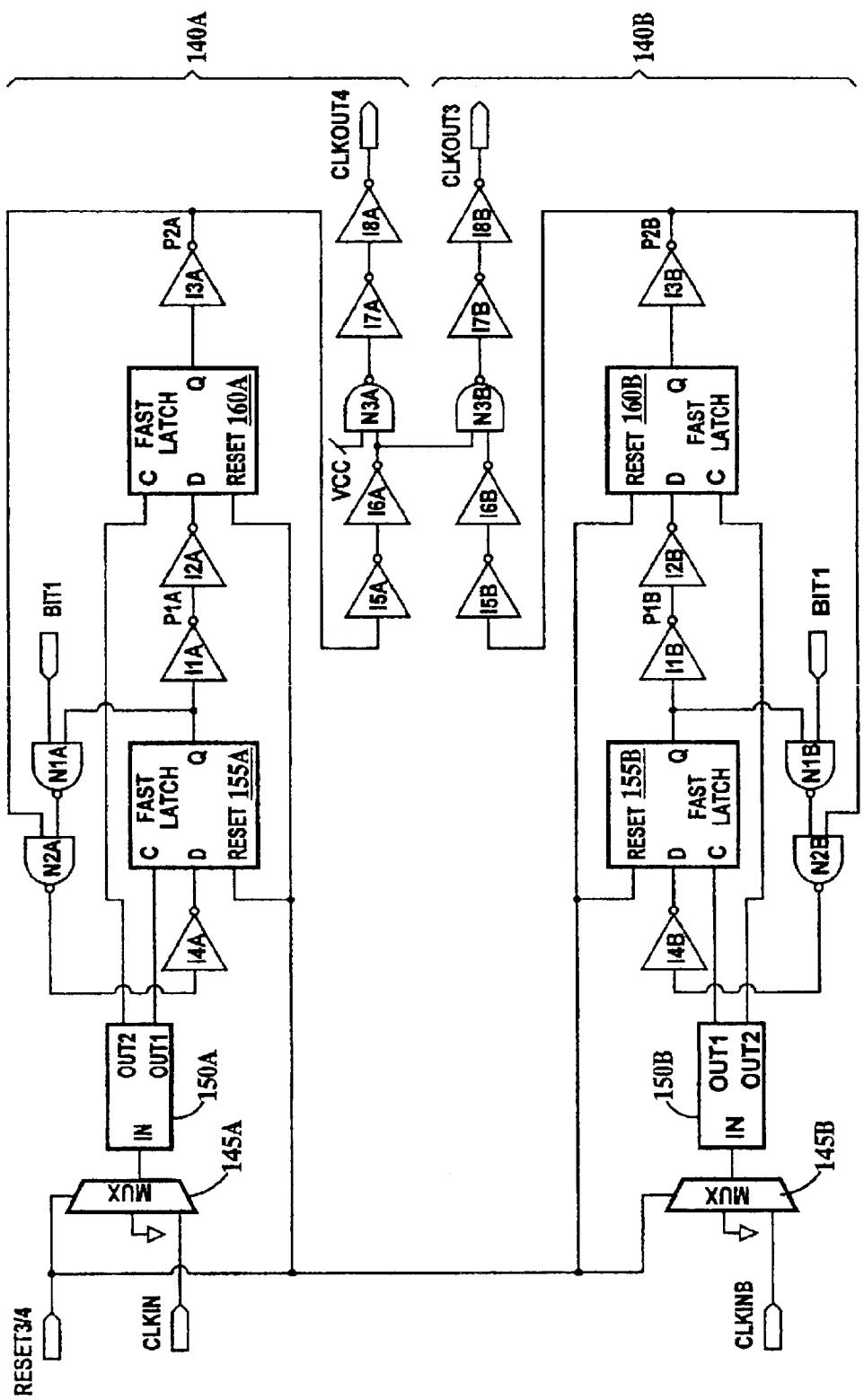
FIG. 2A is a schematic diagram of a first type divide by 3 or frequency divider circuit according to the present invention.
Figure 3:
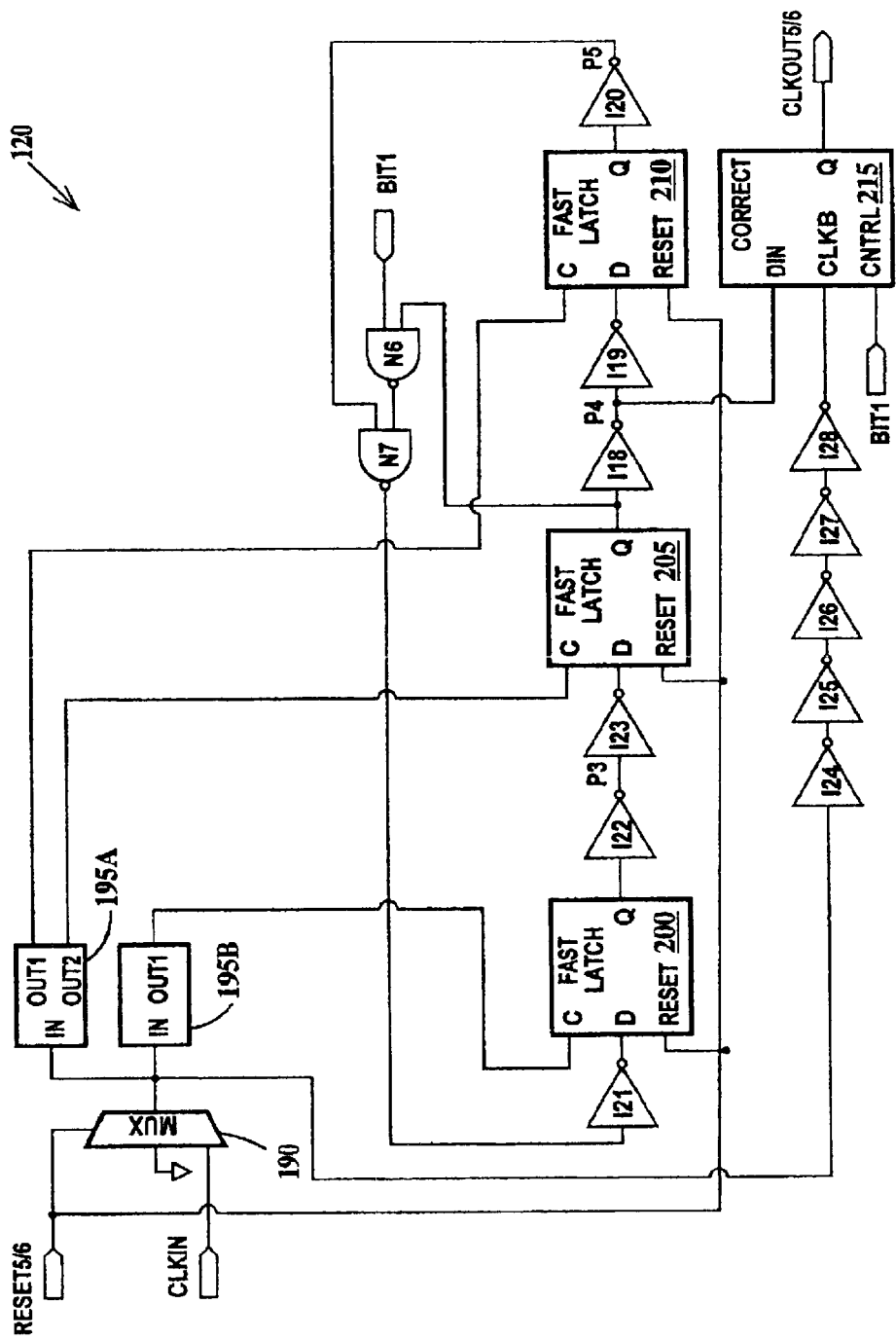
FIG. 3 is a schematic diagram of a divide by 5 or 6 frequency divider circuit according to the present invention.

FIG. 2A is a schematic diagram of a first type divide by 3 or 4 frequency divider circuit according to the present invention. In FIG. 2A, 3/4 divider 115 is comprised of two interconnected similar circuits, a first section 140A and a second section 140B.

Figure 6A:
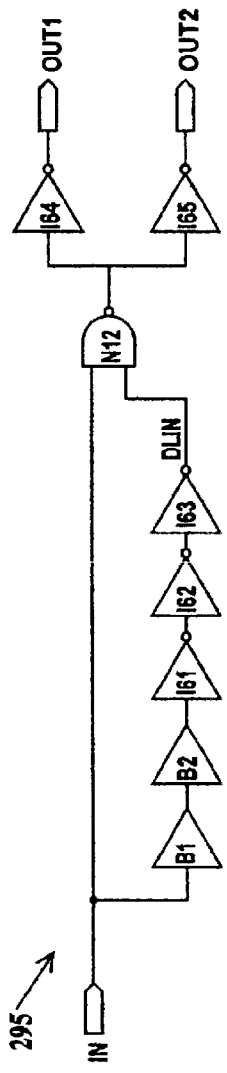
FIG. 6A is a schematic diagram of a one-shot pulse generator according to the present invention.

First section 140A includes an inverting multiplexer 145A, a one-shot generator 150A and two fast latches 155A and 160A. The select input of inverting multiplexer 145A is coupled to RESET3/4, a first input of the inverting multiplexer is coupled to ground and a second input of the inverting multiplexer is coupled to CLKIN. When RESET3/4 is high, the output of inverting multiplexer 145A is high and CLKOUT4 is low saving power. When RESET3/4 is low, the output of inverting multiplexer 145A is inverted CLKIN. The output of inverting multiplexer 145A is coupled to the input of one-shot generator 150A which generates an OUT1 signal coupled to the clock (C) input of fast latch 155A and an OUT2 signal coupled to the C input of fast latch 160A. One-shot generator 150A is illustrated in FIG. 6A and OUT1 and OUT2 are identical signals illustrated in FIG. 6B and described infra. One-shot generator 150A has two outputs in order to increase drive. RESET is coupled to the RESET input of fast latches 155A and 160A. The output (O) of fast latch 155A is coupled to the data (D) input of fast latch 160A through invertors I1A and I2A and to a first input of NAND gate N1A. The output of fast latch 160A is coupled to the input of inverter I3A. The output of inverter I3A is coupled to a first input of NAND gate N2A and to a first input of NAND gate N3A through series inverters I5A and I6A. BIT1 is coupled to a second input of NAND gate N1A and the output of NAND gate N1A is coupled to a second input of NAND gate N2A. The output of NAND gate N2A is coupled to the data input of fast latch 155A through inverter I4A. A second input of NAND gate N3A is coupled to VCC and the output of NAND gate N3A passed through series inverters I7A and I8A to generate CLKOUT4.

Second section 140B includes an inverting multiplexer 145B, a one-shot generator 150B and two fast latches 155B and 160B. The select input of inverting multiplexer 145B is coupled to RESET3/4, a first input of the inverting multiplexer is coupled to ground and a second input of the inverting multiplexer is coupled to CLKINB. When RESET3/4 is high, the output of inverting multiplexer 145B is high and CLKOUT3 is low saving power. When RESET3/4 is low, the output of inverting multiplexer 145B is inverted CLKINB. The output of inverting multiplexer 145B is coupled to the input of one-shot generator 150B which generates an OUT1 signal coupled to the C input of fast latch 155B and an OUT2 signal coupled to the C input of fast latch 160B. One-shot generator 150B is illustrated in FIG. 6A and OUT1 and OUT2 are identical signals illustrated in FIG. 6B and described infra. One-shot generator 150B has two outputs in order to increase drive. RESET is coupled to the RESET input of fast latches 155B and 160B. The output Q of fast latch 155B is coupled to the D input of fast latch 160B through invertors I1B and I2B and to a first input of NAND gate NIB. The output of fast latch 160B is coupled to the input of inverter I3B. The output of inverter I3B is coupled to a first input of NAND gate N2B and to a first input of NAND gate N3B through series inverters I5B and I6B. BIT1 is coupled to a second input of NAND gate N1B and the output of NAND gate NIB is coupled to a second input of NAND gate N2B. The output of NAND gate N2B is coupled to the data input of fast latch 155B through inverter I4B. A second input of NAND gate N3B is coupled to the output of inverter I6A and the output of NAND gate N3B passed through series inverters I7B and I8B to generate CLKOUT3.

Figure 7A:
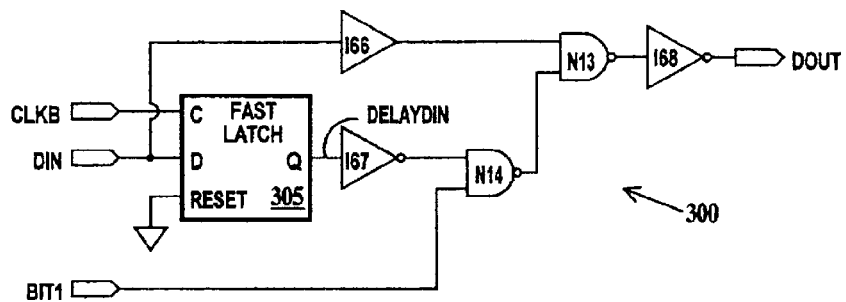
FIG. 7A is a schematic diagram of a clock duty cycle correction circuit according to the present invention.
Figure 7B:
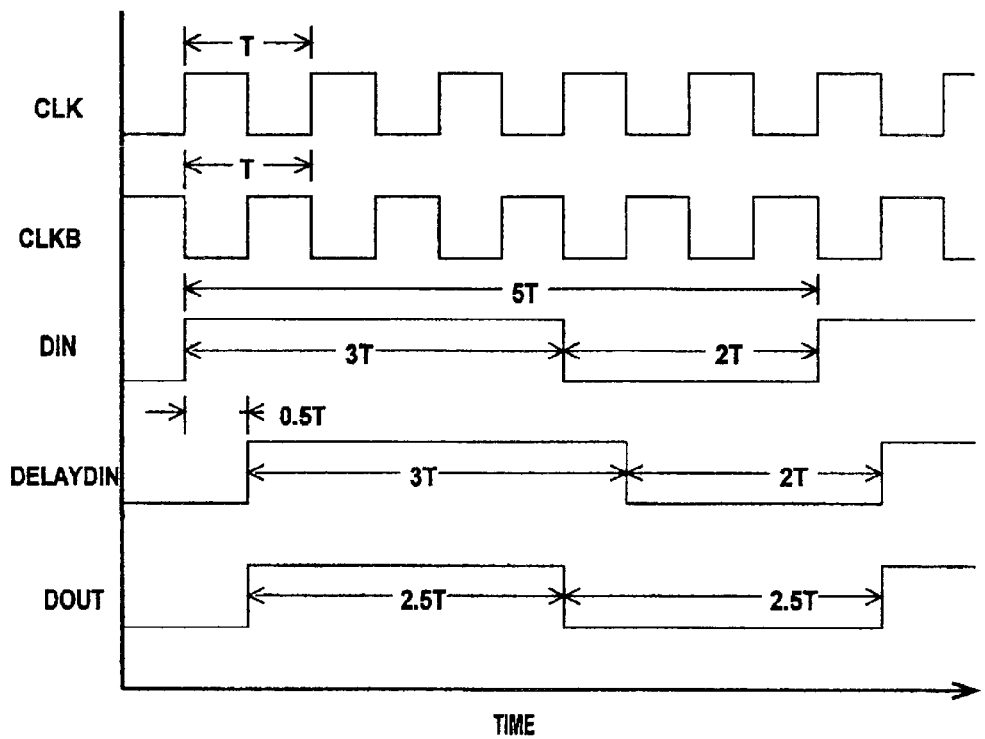
FIG. 7B is a timing diagram of the clock duty cycle correction circuit of FIG. 7A.

One-shot generator 150A generates a clock pulse of user defined length on the rising edge (transition from 0 to 1) of CLKIN and one shot generator 150B generates the same user defined length pulse on the rising edge of CLKINB which is the falling edge (transition from 1 to 0) of CLKIN. The pair of fast latches 155A and 160A (155B and 160B) connected as a shift register provide a divide by 3 or 4 depending on the value of BIT1. NAND gates N1A(B) and N2A(B) couple the output of fast latches 155A(B) and 160A(B) to the input of fast latch 155A(B). For a divide by 3, BIT1 is set to 1, causing NAND gates N1A(B) and N2A(B) to act as a NAND gate with a first input from P2A and a second input from P1A (NAND gate N1A(B) performs the function of inverter I1A(B)). For a divide by 4, BIT1 is set to 0 causing NAND gate N2A(B) to act as an inverter, inverting P2A(B). The two sections 140A and 140B latching on opposite edges of CLKIN provides automatic duty cycle correction via NAND gate N3B because P2A and P2B are shifted exactly half a cycle (of CLKIN) apart. Duty cycle correction is illustrated in FIG. 7B and described infra. Note, the separate CLKOUT3 and CLKOUT4 provide increased drive versus a shared CLK3/4 output which is important in high speed circuits. Insufficient drive or high current loading can slow a circuit down.

In TABLE II, there are only three combinations of logical states of nodes P1A/B and P2A/B when BIT1 is a 1 and four combinations of logical states when BIT1 is a 0. The states are presented in the sequence they appear as the shift register cycles. Only one cycle is shown. The number of different possible states corresponds to the amount by which the frequency of CLKIN is divided.

TABLE II

| State/Node | Divide by 3 | | Divide by 4 | |
| --- | --- | --- | --- | --- |
| | P1A/B | P2A/B | P1A/B | P2A/B |
| 1 | 1 | 1 | 1 | 1 |
| 2 | 0 | 1 | 0 | 1 |
| 3 | 1 | 0 | 0 | 0 |
| 4 | | | 1 | 1 |

Figure 2B:
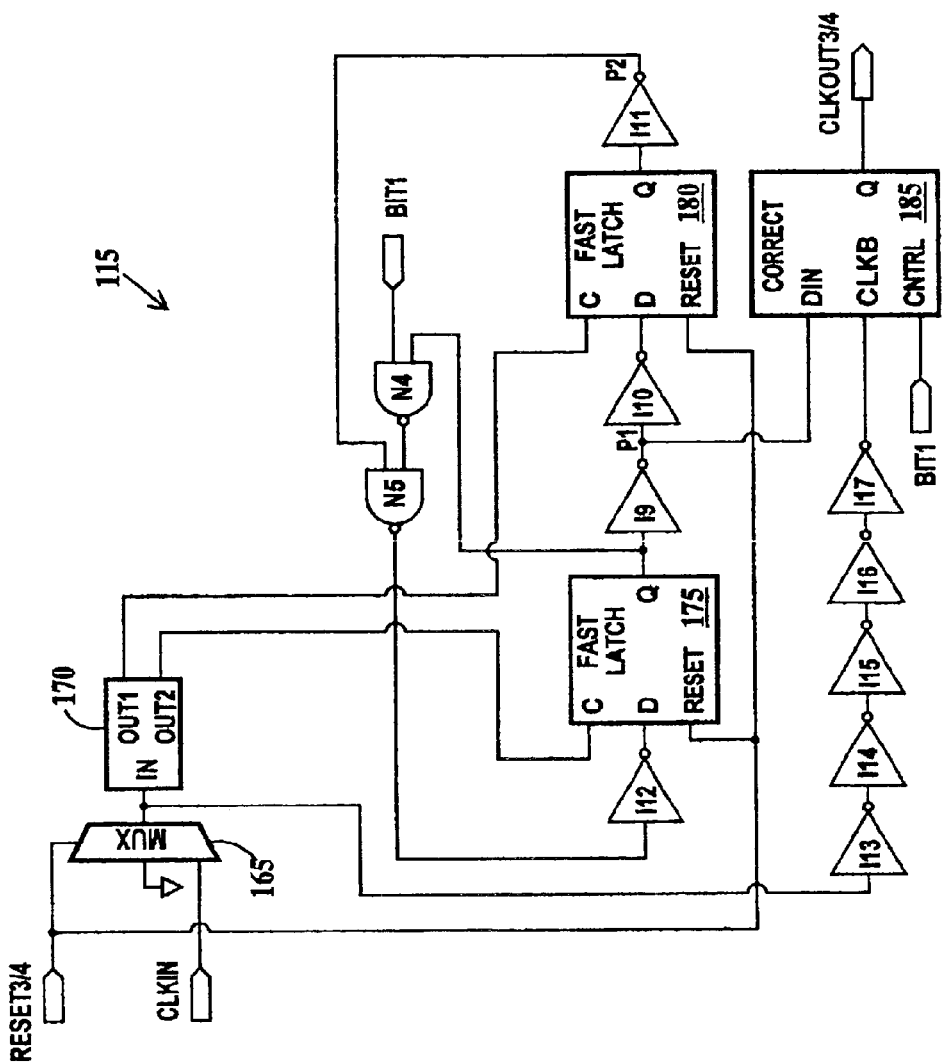
FIG. 2B is a schematic diagram of a second type divide by 3 or 4 frequency divider circuit according to the present invention.
Figure 6B:
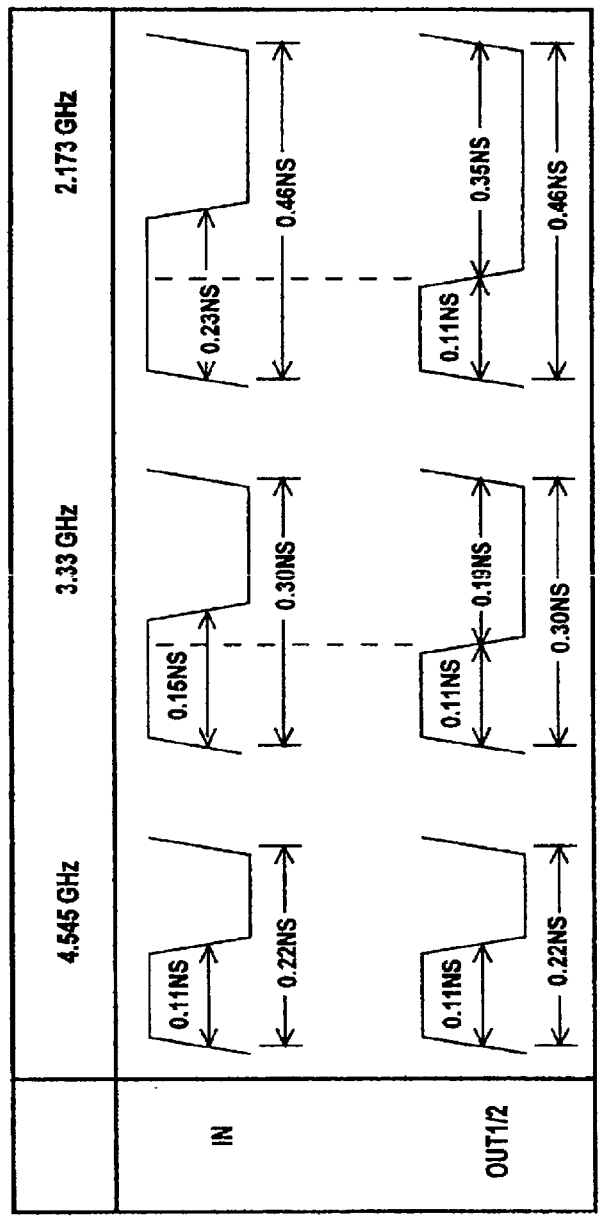
FIG. 6B is a timing diagram of the one-shot generator of FIG. 6A.

FIG. 2B is a schematic diagram of a second type divide by 3 or 4 frequency divider circuit according to the present invention. In FIG. 2B, 3/4 divider 115 includes an inverting multiplexer 165, a one-shot generator 170, two fast latches 175 and 180 and a duty cycle correction circuit 185. The select input of inverting multiplexer 165 is coupled to RESET3/4, a first input of the inverting multiplexer is coupled to ground and a second input of the inverting multiplexer is coupled to CLKIN. When RESET3/4 is high, the output of inverting multiplexer 165 is high and CLKOUT3/4 is low saving power. When RESET3/4 is low, the output of inverting multiplexer 165 is inverted CLKIN. The output of inverting multiplexer 165 is coupled to the input of one-shot generator 170 which generates an OUT1 signal coupled to the C input of fast latch 175 and an OUT2 signal coupled to the C input of fast latch 180. One-shot generator 170 is illustrated in FIG. 6A and OUT1 and OUT2 are identical signals illustrated in FIG. 6B and described infra. One-shot generator 170 has two outputs in order to increase drive. RESET is coupled to the RESET input of fast latches 175 and 180. The output Q of fast latch 175 is coupled to the D input of fast latch 180 through invertors I9 and I10 and to a first input of NAND gate N4. The output of fast latch 180 is coupled to the input of inverter I11. The output of inverter I11 is coupled to a first input of NAND gate N5. BIT1 is coupled to a second input of NAND gate N4 and the output of NAND gate N4 is coupled to a second input of NAND gate N5. The output of NAND gate N5 is coupled to the data input of fast latch 175 through inverter I12. The output of inverting multiplexer 165 is coupled to a CLKB input of duty cycle correction circuit 185 through series inverters I13, I14, I15, I16 and I17. A DIN input of duty cycle correction circuit 185 is coupled between the output of inverter I9 and the input of inverter I10. BIT1 is coupled to a CNTRL input of duty cycle correction circuit 185. The output of duty cycle correction circuit 185 is CLKOUT3/4. Duty cycle correction cycle is illustrated in FIG. 7A and described below.

One-shot generator 150A generates a clock pulse of user defined length on the rising edge (transition from 0 to 1) of CLKIN. The pair of fast latches 175 and 180 connected as a shift register provide a divide by 3 or 4 depending on the value of BIT1. NAND gates N4 and N5 couple the outputs of fast latches 175 and 180 to the input of fast latch 175. For a divide by 3, BIT1 is set to 1, causing NAND gates N4 and N5 to act as a NAND gate with a first input from P2 and a second input from P1 (NAND gate N4 performs the function of inverter I9). For a divide by 4, BIT1 is set to 0, causing NAND gate N5 to act as an inverter, inverting P12. Since duty cycle correction is only required on odd divisions of frequency (i.e. by 3, 5, 7, 9) when BIT1=1 duty cycle correction circuit 185 is in correction mode and when BIT1=0 duty cycle correction circuit 185 is in bypass mode.

FIG. 3 is a schematic diagram of a divide by 5 or 6 frequency divider circuit according to the present invention. In FIG. 3, 5/6 divider 120 includes an inverting multiplexer 190, two one-shot generators 195A and 195B, three fast latches 200, 205 and 210 arranged as a shift register and a duty cycle correction circuit 215. The select input of inverting multiplexer 190 is coupled to RESET5/6, a first input of the inverting multiplexer is coupled to ground and a second input of the inverting multiplexer is coupled to CLKIN. When RESET5/6 is high, the output of inverting multiplexer 190 is high and CLKOUT5/6 is low saving power. When RESET5/6 is low, the output of inverting multiplexer 190 is inverted CLKIN. Note duty cycle correction circuit 215 is coupled between fast latch 205 and fast latch 210, which are the last two latches of the shift register comprised of fast latches 200, 205 and 210. While two one-shot generators are illustrated, (for increased drive) one to three could be used. It will be noticed that 5/6 divider 120 is a homologue of 3/4 divider 115 of FIG. 2A in that an additional, third fast latch has been added to the shift register with appropriate additional one-shot generator circuitry.

One-shot generators 195A and 195B generate a clock pulse of user defined length on the rising edge (transition from 0 to 1) of CLKIN. The three fast latches 200, 205 and 210 connected as a shift register provide a divide by 5 or 6 depending on the value of BIT1. NAND gates N6 and N7 couple the output of fast latches 205 and 210 to the input of fast latch 200. For a divide by 5, BIT1 is set to 1, causing NAND gates N6 and N7 act as a NAND gate with a first input from P5 and a second input from P4 (NAND gate N6 performs the function of inverter I18). For a divide by 6, BIT1 is set to 0, causing NAND gate N7 to act as an inverter, inverting P5. Since duty cycle correction is only required on odd divisions of frequency when BIT1=1 duty cycle correction circuit 215 is in correction mode and when BIT1=0 duty cycle correction circuit 215 is in bypass mode.

In TABLE III, there are only five combinations of logical states of nodes P3, P4 and P5 when BIT1 is a 1 and six combinations of logical states of nodes P3, P4 and P5 when BIT1 is a 0. The states are presented in the sequence they appear as the shift register cycles. Only one cycle is shown. The number of different possible states corresponds to the amount by which the frequency of CLKIN is divided.

TABLE III

| | Divide by 5 | | | Divide by 6 | | |
|---|---|---|---|---|---|---|
| State/Node | P3 | P4 | P5 | P3 | P4 | P5 |
| 1 | 1 | 1 | 1 | 1 | 1 | 1 |
| 2 | 0 | 1 | 1 | 0 | 1 | 1 |
| 3 | 0 | 0 | 1 | 0 | 0 | 1 |
| 4 | 1 | 0 | 0 | 0 | 0 | 0 |
| 5 | 1 | 1 | 0 | 1 | 0 | 0 |
| 6 | | | | 1 | 1 | 0 |

Figure 4:
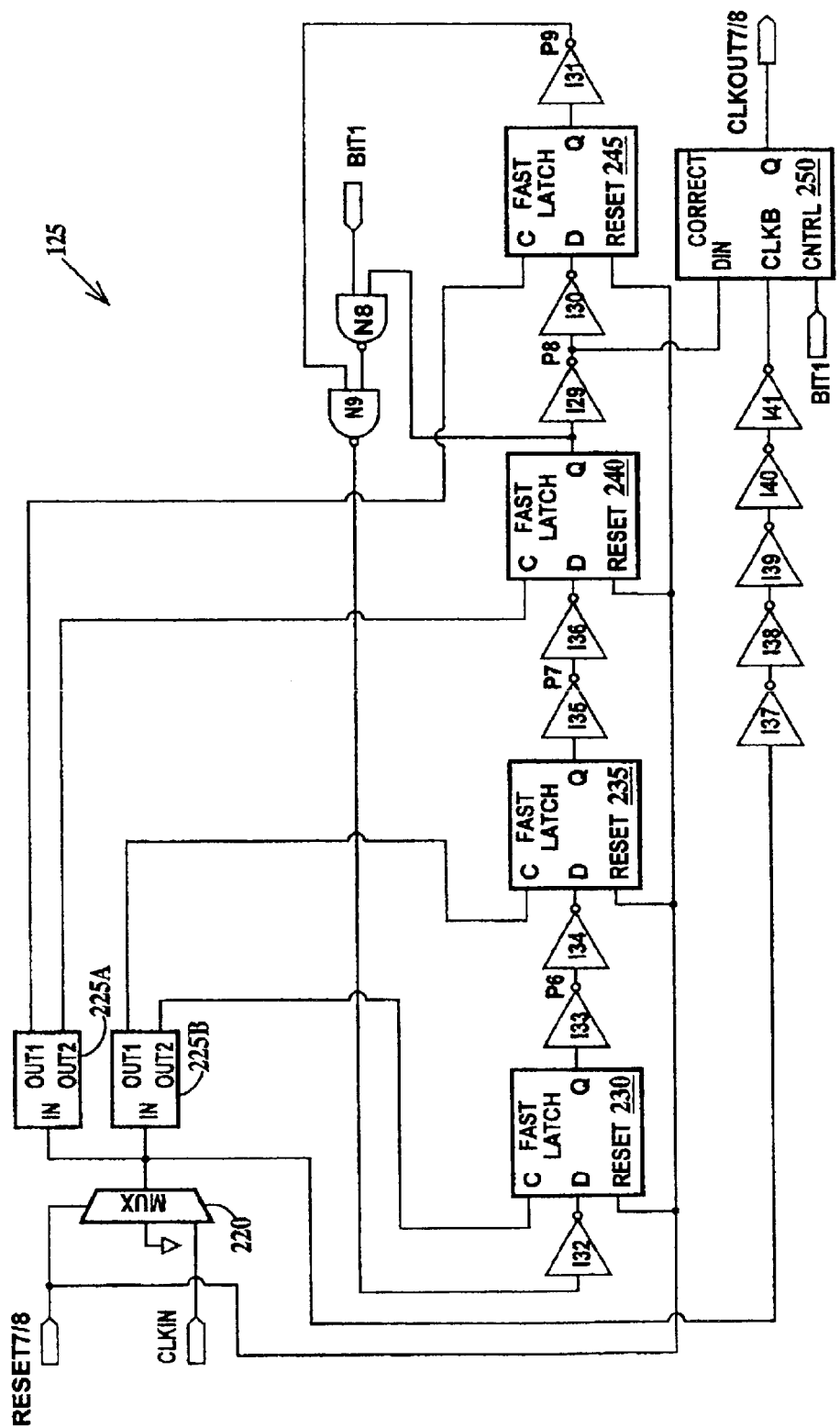
FIG. 4 is a schematic diagram of a divide by 7 or 8 frequency divider circuit according to the present invention.

FIG. 4 is a schematic diagram of a divide by 7 or 8 frequency divider circuit according to the present invention. In FIG. 4, 7/8 divider 125 includes an inverting multiplexer 220, two one-shot generators 225A and 225B, four fast latches 230, 235, 240 and 245 arranged as a shift register and a duty cycle correction circuit 250. The select input of inverting multiplexer 220 is coupled to RESET7/8, a first input of the inverting multiplexer is coupled to ground and a second input of the inverting multiplexer is coupled to CLKIN. When RESET7/8 is high, the output of inverting multiplexer 220 is high and CLKOUT7/8 is low saving power. When RESET7/8 is low, the output of inverting multiplexer 190 is inverted CLKIN. Note duty cycle correction circuit 250 is coupled between fast latch 240 and fast latch 245, which are the last two latches of the shift register comprised of fast latches 230, 235, 240 and 245. While two one-shot generators are illustrated, (for increased drive) one to four could be used. It will be noticed that 7/8 divider 125 is a homologue of 5/6 divider circuit of FIG. 3 in that an additional, fourth fast latch has been added to the shift register with appropriate additional one-shot generator circuitry.

One-shot generators 225A and 225B generate a clock pulse of user defined length on the rising edge (transition from 0 to 1) of CLKIN. The four fast latches 230, 235, 240 and 245 connected as a shift register provide a divide by 7 or 8 depending upon the value of BIT1. NAND gates N8 and N9 couple the output of fast latches 240 and 245 to the input of fast latch 230. For a divide by 7, BIT1 is set to 1, causing NAND gates N8 and N9 act as a NAND gate with a first input from P9 and a second input from P8 (NAND gate N8 performs the function of inverter I29). For a divide by 4, BIT1 is set to 0, causing NAND gate N9 to act as an inverter, inverting P9. Since duty cycle correction is only required on odd divisions of frequency when BIT1=1 duty cycle correction circuit 250 is in correction mode and when BIT 1=0 duty cycle correction circuit 250 is in bypass mode.

In TABLE IV, there are only seven combinations of logical states of nodes P6, P7, P8 and P9 when BIT1=1 and eight combinations of logical states of nodes P6, P7, P8 and P9 when BIT1=0. The states are presented in the sequence they appear as the shift register cycles. Only one cycle is shown. The number of different possible states corresponds to the amount by which the frequency of CLKIN is divided.

TABLE IV

| | Divide by 7 | | | | Divide by 8 | | | |
|---|---|---|---|---|---|---|---|---|
| State/Node | P6 | P7 | P8 | P9 | P6 | P7 | P8 | P9 |
| 1 | 1 | 1 | 1 | 1 | 1 | 1 | 1 | 1 |
| 2 | 0 | 1 | 1 | 1 | 0 | 1 | 1 | 1 |
| 3 | 0 | 0 | 1 | 1 | 0 | 0 | 1 | 1 |
| 4 | 0 | 0 | 0 | 1 | 0 | 0 | 0 | 1 |
| 5 | 1 | 0 | 0 | 0 | 0 | 0 | 0 | 0 |
| 6 | 1 | 1 | 0 | 0 | 1 | 0 | 0 | 0 |
| 7 | 1 | 1 | 1 | 0 | 1 | 1 | 0 | 0 |
| 8 | | | | | 1 | 1 | 1 | 0 |

Figure 5:
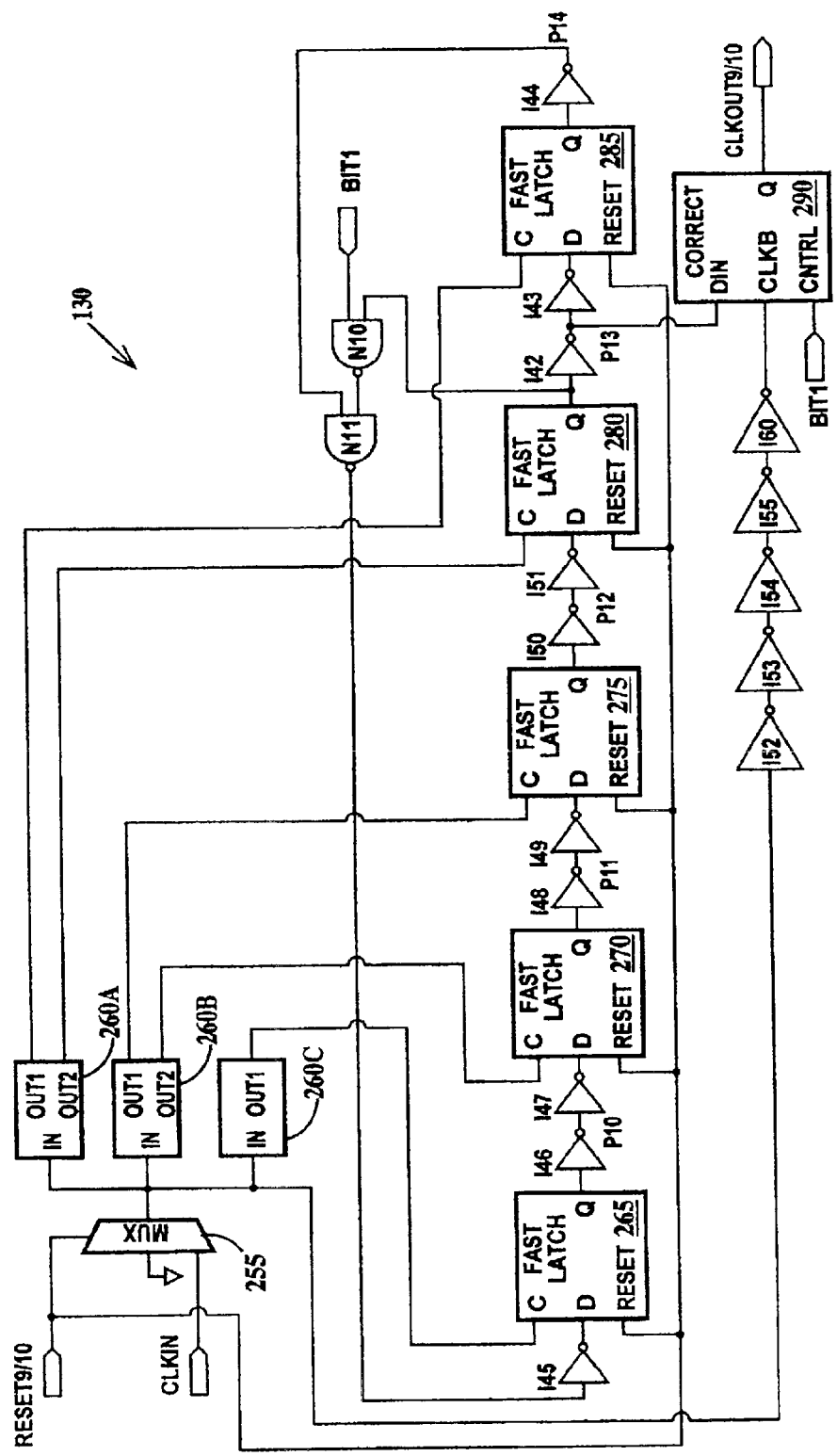
FIG. 5 is a schematic diagram of a divide by 9 or 10 frequency divider circuit according to the present invention.

FIG. 5 is a schematic diagram of a divide by 9 or 10 frequency divider circuit according to the present invention. In FIG. 5, 9/10 divider 130 includes an inverting multiplexer 255, three one-shot generators 260A, 260B and 260C, five fast latches 265, 270, 275, 280 and 285 arranged as a shift register and a duty cycle correction circuit 290. The select input of inverting multiplexer 255 is coupled to RESET9/10, a first input of the inverting multiplexer is coupled to ground and a second input of the inverting multiplexer is coupled to CLKIN. When RESET9/10 is high, the output of inverting multiplexer 255 is high and CLKOUT9/10 is low saving power. When RESET9/10 is low, the output of inverting multiplexer 255 is inverted CLKIN. Note duty cycle correction circuit 290 is coupled between fast latch 280 and fast latch 285, which are the last two latches of the shift register comprised of fast latches 265, 270, 275, 280 and 285. While three one-shot generators are illustrated, (for increased drive) one to five could be used. It will be noticed that 9/10 divider 130 is a homologue of 7/8 divider circuit of FIG. 4 in that an additional, fifth fast latch has been added to the shift register with appropriate additional one-shot generator circuitry.

One-shot generators 260A, 260B and 260C generate a clock pulse of user defined length on the rising edge (transition from 0 to 1) of CLKIN. The five fast latches 265, 270, 275, 280 and 285 connected as a shift register provide a divide by 9 or 10 depending upon the value of BIT1. The four fast latches 230, 235, 240 and 245 connected as a shift register provide a divide by 9 or 10 depending upon the value of BIT1. NAND gates N10 and N11 couple the output of fast latches 280 and 285 to the input of fast latch 265. For a divide by 9, BIT1 is set to 1, causing NAND gates N10 and N11 act as a NAND gate with a first input from P14 and a second input from P13 (NAND gate N10 performs the function of inverter I42). For a divide by 4, BIT1 is set to 0 causing NAND gate N11 to act as an inverter, inverting P14. Since duty cycle correction is only required on odd divisions of frequency when BIT1=1 duty cycle correction circuit 290 is in correction mode and when BIT1=0 duty cycle correction circuit 290 is in bypass mode.

In TABLE V, there are only seven combinations of logical states of nodes P10, P11, P12, P13 and P14 when BIT1=1 and eight combinations of logical states of nodes P10, P11, P12, P13 and P14 when BIT1=0. The states are presented in the sequence they appear as the shift register cycles. Only one cycle is shown. The number of different possible states corresponds to the amount by which the frequency of CLKIN is divided.

OUT1 and OUT2 will always have a high signal time duration equal to that of the high signal time duration of a clock at MAXFREQ but the low signal time duration of OUT1 and OUT 2 will be greater than the low signal time duration of a clock signal at MAXFREQ. This is illustrated in FIG. 6B. The difference in frequency between MAXFREQ and CLKINMAXFREQ is purposeful and prevents data just shifted into a fast latch to be shifted again into the following latch on the same clock cycle of any of the frequency divider circuits described supra.

FIG. 6B is a timing diagram of the one-shot generator of FIG. 6A. Each cycle of a CLKIN signal at MAXFREQ=4.545 GHz will have a high signal time duration of 0.11 ns and a low signal time duration of 0.11 ns and OUT1 and OUT2 will have a high signal time durations of 0.11 ns and low signal time durations of 0.11 ns. One cycle of a CLKIN signal at a frequency=3.33 GHz will have a high signal time duration of 0.15 ns and a low signal time duration of 0.15 ns and OUT1 and OUT2 will have high signal time durations

TABLE V

| State/Node | Divide by 9 | | | | | Divide by 10 | | | | |
| --- | --- | --- | --- | --- | --- | --- | --- | --- | --- | --- |
| | P10 | P11 | P12 | P13 | P14 | P10 | P11 | P12 | P13 | P14 |
| 1 | 1 | 1 | 1 | 1 | 1 | 1 | 1 | 1 | 1 | 1 |
| 2 | 0 | 1 | 1 | 1 | 1 | 0 | 1 | 1 | 1 | 1 |
| 3 | 0 | 0 | 1 | 1 | 1 | 0 | 0 | 1 | 1 | 1 |
| 4 | 0 | 0 | 0 | 1 | 1 | 0 | 0 | 0 | 1 | 1 |
| 5 | 0 | 0 | 0 | 0 | 1 | 0 | 0 | 0 | 0 | 1 |
| 6 | 1 | 0 | 0 | 0 | 0 | 0 | 0 | 0 | 0 | 0 |
| 7 | 1 | 1 | 0 | 0 | 0 | 1 | 0 | 0 | 0 | 0 |
| 8 | 1 | 1 | 1 | 0 | 0 | 1 | 1 | 0 | 0 | 0 |
| 9 | 1 | 1 | 1 | 1 | 0 | 1 | 1 | 1 | 0 | 0 |
| 10 | | | | | | 1 | 1 | 1 | 1 | 0 |

FIG. 6A is a schematic diagram of a one-shot generator 295 according to the present invention. One-shot generator 295 is exemplary of one-shot generators 150A and 150B of FIG. 2A, one-shot generator 170B of FIG. 2B, one-shot generators 195A and 195B of FIG. 3, one-shot generators 225A and 225B of FIG. 4, and one-shot generators 260A, 260B and 260C of FIG. 5. A first input a NAND gate N12 is coupled to an IN signal (which in the present invention is CLKIN or CLKINB in the case of one-shot generator 150B of FIG. 2A) and to the input of buffer B1. The output of buffer B1 is coupled to the input of buffer B2. The output of buffer B2 is coupled to the input of inverter I61. The output of inverter I61 is to the input of inverter I62. The output of inverter I62 is coupled to the input of inverter I63. The output of inverter I63 is coupled to a second input of NAND gate N12. The output of NAND gate N12 is coupled to the inputs of inverters I64 and I65. The outputs of inverters I64 and I65 are signals OUT1 and OUT2 respectively.

The propagation delay through buffers B1 and B2 and inverters I61, I62 and I63 is chosen such that OUT1 and OUT2 have a 50% duty cycle at a maximum frequency of MAXFREQ. MAXFREQ is defined as about 5 to 15% higher than the maximum allowable frequency of CLKIN (CLKINMAQXFREQ) and is defined by equation 1:

$$MAXFREQ = CLKINMAXFREQ + WINDOW(CLKINMAXFREQ) \quad (1)$$

where:
MAXFREQ=maximum frequency of the one-shot generator,
CLKINMAXFREQ=maximum frequency divider circuits can operate on; and
WINDOW=5 to 15%.

of 0.11 ns and low signal time durations of 0.19 ns. Each cycle of a CLKIN signal at a frequency=2.173 GHz will have a high signal time duration of 0.23 ns and a low signal time duration of 0.23 ns and OUT1 and OUT2 will have high signal time durations of 0.11 ns and a low signal time duration of 0.35 ns. Thus, one-shot generator 295 provides a clock signal with a constant high time, which is independent of the high time of CLKIN. It should be remembered that OUT1 and OUT2 are the clock inputs to the fast latches of the divider circuits described supra and those latches switch on the rising clock edge as described infra in relation to FIG. 8. In one example, MAXFRQ is about 4.545 GHz, corresponding to a time-period of 0.22 ns. Assuming a 50% duty cycle, the on time is 0.11 ns. 0.11 ns is a short enough clock on time just sufficient to transfer data from the input of a fast latch to the output of the fast latch yet prevent data just shifted into a fast latch to be shifted again into the following fast latch on the same CLKIN (or CLKINB) clock cycle in the frequency divider circuits described supra.

FIG. 7A is a schematic diagram of a clock duty cycle correction circuit 300 according to the present invention. Duty cycle correction circuit 300 is exemplary of duty cycle correction circuits 185 of FIG. 2B, 215 of FIG. 3, 250 of FIGS. 4 and 290 of FIG. 5. In FIG. 7A, clock duty cycle circuit 300 includes a fast latch 305, buffer 166, inverters I67 and I68 and NAND gates N13 and N14. CLKB is coupled to the C input of fast latch 305. DIN (from a node of a shift register of divider circuits described supra) is coupled to the D input of fast latch 305 and to the input of buffer 166. The reset of fast latch 305 is coupled to ground and the output of fast latch 305 is coupled to the input of inverter I67. BIT1 is coupled to a first input of NAND gate N14 and the output of inverter I67 is coupled to a second input of NAND gate N14. The output of NAND gate N14 is coupled to a first input of NAND gate N13 and the output of inverter I66 is coupled to a second input of NAND gate N13. The output of NAND gate N13 is coupled to the input of inverter I68. The output of inverter I68 is DOUT, which is a duty cycle corrected version of DIN.

BIT1 applied to NAND gate N14 prevents duty cycle correction being performed on even divisions of frequency (see TABLE I supra).

FIG. 7B is a timing diagram of the clock duty cycle correction circuit of FIG. 7A. FIG. 7A utilizes the operation of 5/6 divider 120 of FIG. 3 to illustrate duty cycle correction for a divide by 5 operation. In FIG. 7B, CLK and CLKB have a cycle time of T, DIN has a cycle time of 5 T but is high for a time of 3 T and low for a time of 2 T, a 60% duty cycle). This may also may be seen by referring to the P4 node column under Divide by 5 of TABLE III which is 11001 (11100) where each one represents a high DIN signal for one CLKIN cycle T and each 0 represents a low DIN signal for one CLKIN cycle T. DELAYDIN is shifted one half CLKIN time cycle (T/2) from DIN. Buffer 166 has the same delay as the total delay through fast latch 305, inverter I67 and NAND gate N14 so that the output of NAND gate N14 and the output of buffer 166 are half a clock CLKIN cycle apart (T/2) apart. DOUT, which is the result of NAND gate N13 of FIG. 7A has a signal high time of 2.5 T and a signal low time of 2.5 T, and thus a 50% duty cycle. That no correction is needed for a divide by 6 may also be by seen referring to the P4 node column under Divide by 5 of TABLE III which is 110001 (111000).

FIG. 8 is a schematic diagram of a fast latch 310 according to the present invention. Fast latch 310 is exemplary of fast latches 155A, 155B, 160A and 160B of FIG. 2A, of fast latches 175 and 180 of FIG. 2B, of fast latches 200, 205 and 210 of FIG. 3, of fast latches 230, 235, 240, and 245 of FIG. 4, of fast latches 265, 270, 275, 280 and 285 of FIG. 5 and of fast latch 305 of FIG. 7A. Fast latch 310 includes a NAND stage 315 comprised of PFETs (P-channel field effect transistor) T1 and T4 and NFETs (N-channel field effect transistor) T2, T3, T5 and T6, a clocked inverter stage 320 comprised of PFET T7 and NFETs T8 and T9, a first inverter stage 325 comprised of a PFET T10 and an NFET T11 and a second inverter stage 330 comprised of a PFET T12 and an NFET T13. First inverter stage also includes a reset PFET.

The sources of PFETS T1, T4, T7, T10 and T12 are coupled to VCC and the sources of NFETs T3, T6, T9 and T13 and the drain of NFET T14 are coupled to ground. The gates of PFET T1 and NFETs T2, T5 and T8 are coupled to the C (clock) input of fast latch 310. The gates of PFET T4 and NFETs T3 and T6 are coupled to the D (data) input of fast latch 310. The drains of PFETs T1 and T4 and NFETs T2 and T5 and the gates of PFET T7 and NFET T9 are coupled to a node P15. The source of NFET T8 is coupled to the drain of NFET T9. The drains of PFET T7 and NFET T8, the source of PFET T14 and the gates of PFET T10 and NFET T11 are coupled to a node P16. The drains of PFET T10 and NFET T11 and the gates of PFET T12 and NFET T13 are coupled to a node P17. The drains of PFET T12 and NFET T13 are coupled to the output (Q) of fast latch 310. RESET is coupled to the gate of NFET T14 through serially coupled inverters I69 and I70.

In operation, a high on RESET turns on NFET T14 bringing node P16 to ground, turning PFET T10 on bringing node P17 high and turning NFET T13 on bringing Q low. When C is low, PFET T1 turns on precharging node P15 high and PFET T7 and NFET T8 turns off, isolating node P16 and preserving the state of node P16. When C is high a high or low on D will influence the state of node P15. Node P15 will assume the state corresponding to the inverse of D.

If, with C high, D is high NFETs T3 and T6 turn on, PFET T4 turns off and, node P15 is pulled low. With C high, PFET T7 turns on, NFET T9 turns off and node P16 is pulled high. A high on node P16 turns on NFET T11 and turns off PFET T10 bringing node P17 low. A low on node P17 turns on PFET T12 and turns off NFET T13 bringing Q high.

If, with C high, D is low NFETs T3 and T6 turn off, PFET T4 turns on and, node P15 is remains high (the precharge state). With C high, NFET T9 turns on, PFET T7 turns off and node P16 is pulled low. A low on node P16 turns on PFET T10 and turns off NFET 11 bringing node P17 high. A high on node P17 turns on NFET T13 and turns off PFET T12 bringing Q low.

With C high NFET T8 turns on and node P16 is determined by the state of node P15, a high on node P15 turning on NFET T9 and turning off PFET T7 off bringing node P16 low and a low on node P15 turning off NFET T9 and turning on PFET T7 bringing node P16 high. Thus, the state of node P15 (determined by the state of D) is only transferred to node P16 when C is high. Since node P15 is precharge high, transfer of high from P15 to P16 is very fast. It should be remembered that the pulse width of C in the frequency divider circuits described supra is user defined and it is this width that determines when data transfer between nodes P15 and P16 can take place. The latch capture time is defined by equation 2:

$$LCT=1/(2(CLKINMAXFREQ)) \qquad (2)$$

where:

LCT is the latch capture time;

CLKINMAXFREQ=maximum frequency divider circuits can operate on.

Figure 9:
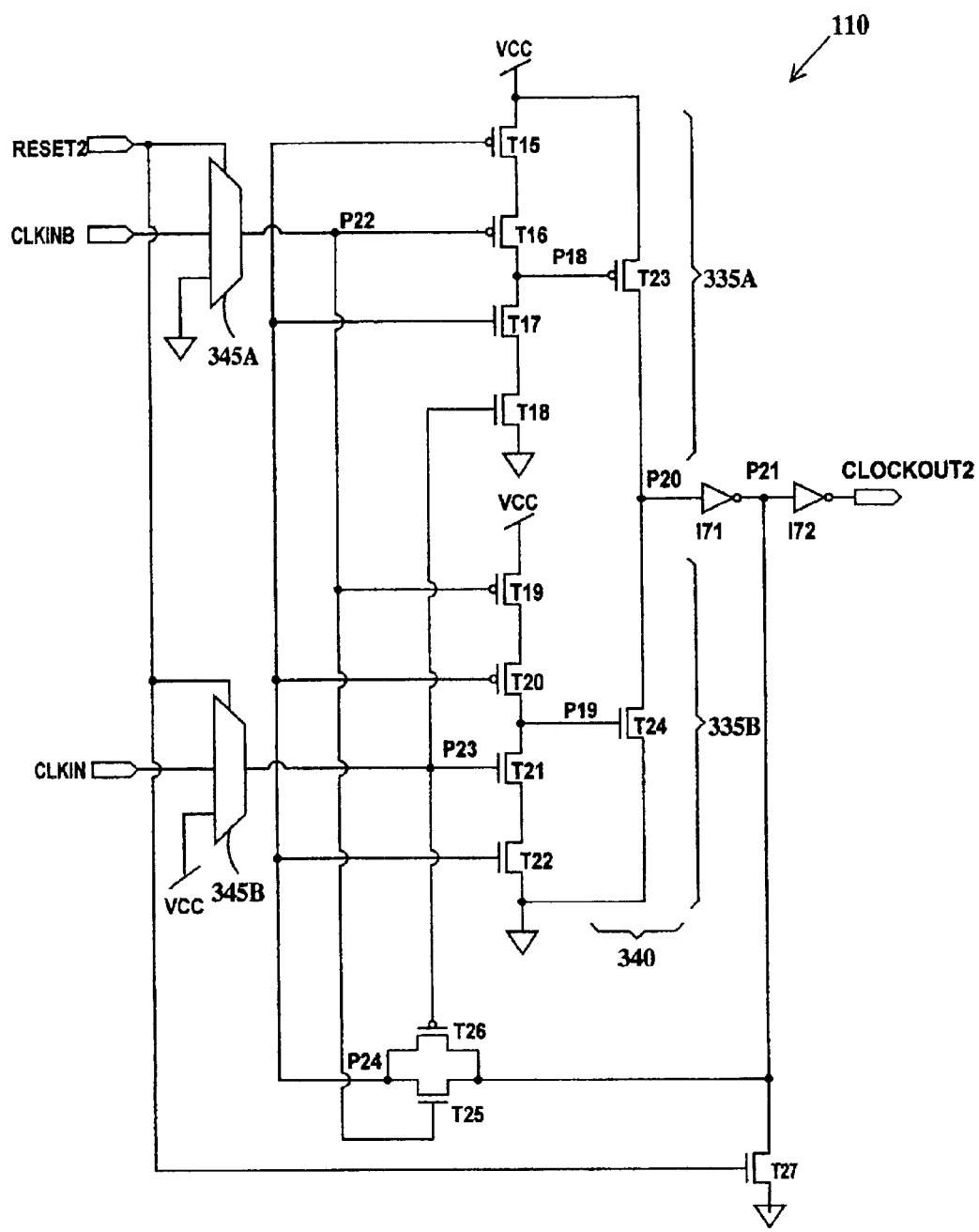
FIG. 9 is a schematic a schematic diagram of a frequency a divide by 2 frequency divider circuit according to the present invention.

FIG. 9 is a schematic a schematic diagram of a frequency divide by 2 frequency divider circuit according to the present invention. This frequency divider does not utilize fast latches as described supra and is not a homologue of the divider circuits presented supra. In FIG. 9, 2 divider 110 includes a first transistor cascade 335A comprising PFETs T15 and T16 and NFETs T17 and T18 cascaded between power supply VCC and ground and a second transistor cascade 335B comprising PFETs T19 and T20 and NFETs T21 and T22 cascaded between VCC and ground; the source of PFET T15 (T19) coupled to VCC, the drain of PFET T15 (T19) coupled to the source of PFET T16 (T20), the drain of PFET T16 (T20) coupled to the drain of NFET T17 (T21) which is node P18 (P19), the source of NFET T17 (T21) coupled to the drain of NFET T18 (T22) and the source of NFET T17 (T22) coupled to ground. A PFET T23 and an NFET T24 form an inverter 340, the source of PFET T23 coupled to VCC, the drain of PFET T23 coupled to the drain of NFET T24 which is node P20, the source of NFET T24 coupled to ground, the gate of PFET T23 coupled to node P18 and the gate of NFET T24 coupled to node P19. An inverter I71 is coupled between node P20 and a node P21. An inverter I72 is coupled between node P21 and the CLKOUT2 output of 2 divider 110.

In state 1, when RESET2 transitions to 0, CLKIN=0 and CLKINB=1, then node P22 transitions to 0, node P23 transitions to 1, PFETs T15, T16, T19 and T20 are on, NFETs T18 and T22 are on, node P18=1, node P19=1, NFET T24 is on, node P20 transitions to 0, node P21 transitions to 1, CLKOUT2 transitions to 0, NFET T25 and PFET T26 are off so node P24=0.

In state 2, when CLKIN transitions to 1 and CLKINB transitions to 0, then node P24=0, node P22 transitions to 1, node P23 transitions to 0, PFETs T16 and T20 are off, NFETs T18 and T22 are off, nodes P18 and P19 hang at 1, NFET T24 is on, node P20=0, node P21=1, CLKOUT2=0, NFET T25 and PFET T26 are on so node P21 transitions to 1 and node P24 transitions to 1.

In state 3, when CLKIN transitions to 0 and CLKINB transitions to 1, then node P22 transitions to 0, node P23 transitions to 1, PFETs T16 and T20 are on, NFETs T18 and T22 are on, node P18 transitions to 0, node P19 transitions to 0, PFET T23 is on, NFET T24 is off, node P20 transitions to 1, node P21 transitions to 0 and CLKOUT2 transitions to 1, NFET T25 and PFET T26 are off so node P24=0 so node β24=1 retaining its previous value.

In state 4, when CLKIN transitions to 1 and CLKINB transitions to 0, then node P22 transitions to 1, node P23 transitions to 0, PFET T26 and NFET T25 are on, nodes P24 and P21 are equal, PFETs T16 and T20 are off, NFETs T18 and T22 are off, nodes P18 and P19 hang at 0, PFET T23 is on, NFET T24 is off, node P20=1, node P21=0 and CLKOUT2 transitions to 1.

The four states of 2 divider 110 are illustrated in TABLE VI.

TABLE VI

| Node P24 | CLKIN | CLKOUT 2 |
|---|---|---|
| 0 | 0 | 0 |
| 0 | 1 | 0 |
| 1 | 0 | 1 |
| 1 | 1 | 1 |

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. Therefore, it is intended that the following claims cover all such modifications and changes as fall within the true spirit and scope of the invention.

What is claimed is:

1. A frequency divider generating an output clock signal, comprising:
   a one-shot generator, an input of said one-shot generator coupled to an input clock signal and an output of said one shot generator coupled to clock inputs of at least two latches, said latches arranged as a shift rgister, a data output of a previous latch of said shift register coupled to a data input of a following latch of said shift register and a data output of a last latch of said shift register coupled to a data input of a first latch of said shift register;
   an output of said frequency divider coupled to an output of a next to last latch of said shift register; and
   wherein, the frequency of said output clock signal is a function of the frequency of said input clock signal and the number of said latches.

2. The frequency divider of claim 1, further including:
   a logic network responsive to a control signal, said logic network coupled to the data output of a next to last latch of said shift register and to the data output said last latch and the data input of said first latch; and
   said logic network, based on a value of said control signal, either further coupling the data output of said next to last latch to the data input of said first latch or only coupling the data output of said last latch to the data input of said first latch.

3. The frequency divider of claim 2, wherein:
   the frequency of said output clock signal when said control signal has a first value is the frequency of said input clock signal divided by a first number, said first number equal to twice the number of latches in said shift register, and
   the frequency of said output clock signal when said control signal has a second value is the frequency of said input clock signal divided by a second number, wherein said second number is equal to one less than said first number.

4. The frequency divider circuit of claim 2, further comprising a output clock duty cycle correction circuit coupled between the output of said next to last latch and the output of said frequency divider.

5. The frequency divider of claim 4, wherein said output clock duty cycle correction circuit is adapted to correct only output clock frequencies where the ratio of the input clock frequency divided by the output clock frequency is an odd number and based upon an additional control signal.

6. The frequency divider of claim 1, further including additional one-shot generators, an input of said additional one-shot generators coupled to an output of an inverting multiplexer and outputs of said one-shot generator and each additional one-shot generator connected to the clock input of different latches.

7. The frequency divider of claim 1, wherein all said latches comprise:
   a NAND stage adapted to receive said injput clock signal and a data input signal from a previous latch;
   a clocked inverter stage, a first input of said clocked inverter stage coupled to an output of said NAND stage and a second input of said clocked inverter stage coupled to said input clock signal;
   a first inverter stage, a first input of said first inverter stage coupled to an output of said clocked inverter stage and a second input of said first inverter stage coupled to a reset signal; and
   a second inverter stage having an input coupled to an output of first inverter stage and an output.

8. A programmable frequency divider, comprising:
   a multiplicity of frequency dividers each geneating a different output clock signal, each comprising:
      a one-shot generator, an input of said one-shot generator coupled to an input clock signal and an output of said one shot generator coupled to clock inputs of at least two latches, said latches arranged as a shift register, a data output of a previous latch of said shift register coupled to a data input of a following latch of said shift register and a data output of a last latch of said shift register coupled to a data input of a first latch of said shift register;
      an output of said frequency divider coupled to an output of a next to last latch of said shift register; and
      wherein, the frequency of each output clock signal is a function of the frequency of said input clock signal and the number of said latches in each frequency divider;
   wherein the number of latches in each frequency divider is different;
   means for generating a different reset signal for each frequency divider; and
   means for selecting and coupling one said output clock signal of one said frequency divider to a clock output of said programmable divider.

9. The programmable frequency divider of claim 8, wherein each frequency divider further includes:
   a logic network responsive to a common control signal, said logic network coupled to a data output of a next to last latch of said shift register and to the data output said last latch and the data input of said first latch; and
   said logic network, based on a value of said common control signal, either further coupling the data output of said next to last latch to the data input of said first latch or only coupling the data output of said last latch to the data input of said first latch.

10. The programmable frequency divider of claim 9, wherein:
    the frequency of said output clock signal when said control signal has a first value is the frequency of said input clock signal divided by a first number, said first number equal to twice the number of latches in said shift register, and
    the frequency of said output clock signal when said control signal has a second value is the frequency of said input clock signal divided by a second number, wherein said second number is equal to one less than said first number.

11. The programmable frequency divider circuit of claim 9, wherein each frequency divider further comprises an output clock duty cycle correction circuit coupled between the output of said next to last latch and said output of said frequency divider.

12. The programmable frquency divider of claim 11, wherein said output clock duty cycle correction circuit of each frequency divider is adapted to correct only output clock frequencies where the ratio of said input clock frequency divided by said output clock frequency is an odd number and is based upon an additional control signal.

13. The programmable frequency divider of claim 8, wherein each frequency divider further includes additional one-shot generators, the output of each one-shot generator connected to the clock input of different latches of each frequency divider.

14. The programmable frequency divider of claim 8, wherein all said latches of all said frequency dividers comprise:
    a NAND stage adapted to receive said input clock signal and to receive a data input signal from a previous latch of said frequency divider;
    a clocked inverter stage, a first input of said clocked inverter stage coupled to an output of said NAND stage and a second input of said clocked inverter stage coupled to said input clock signal;
    a first inverter stage, a first input of said first inverter stage coupled to an output of said clocked inverter stage and a second input of said first inverter stage coupled to a reset signal; and
    a second inverter stage having an output, an input of said first inverter stage coupled to an output of said first inverter stage.

15. The programmable frequency divider of claim 8, wherein one of said frequency dividers is a divide by two frequency divider and is a state machine.

16. The programmable frequency divider of claim 8, wherein one said frequency divider is a divide by 3 or 4 frequency divider, said 3 or 4 frequency divider including first and second identical circuits each comprising:
    a one-shot generator, an input of said one-shot generator coupled to said input clock signal and an output of said one-shot generator coupled to clock inputs of a first and a second latch, said first and second latches arranged as a shift register, a data output of said first latch coupled to a data input of said second latch and a data output of said second latch coupled to a data input of said first latch;
    a logic network responsive to a control signal, said logic network coupled to the data output of said first latch, to the data output of said second latch and to the data input of said first latch;
    said logic network, based on a value of said control signal, further coupling the data output of said first latch to the data input of said first latch; and
    an additional logic network coupling outputs of said first and second circuits to a divide by 3 output or a divide by 4 output of said divide by 3 or 4 frequency divider.

* * * * *

UNITED STATES PATENT AND TRADEMARK OFFICE
CERTIFICATE OF CORRECTION

PATENT NO.    : 6,917,662 B2
DATED         : July 12, 2005
INVENTOR(S)   : Austin et al.

It is certified that error appears in the above-identified patent and that said Letters Patent is hereby corrected as shown below:

Column 2,
Lines 4-6, delete "coupling one the output clock signal of one the frequency divider to a clock output of the programmable divider " and insert -- coupling the output clock signal of one of the frequency dividers to a clock output of the programmable frequency divider --.
Lines 51-52, delete "a schematic a schematic diagram of a frequency a divide by 2" and insert -- a schematic of a frequency divide by 2 --.

Column 4,
Line 10, delete "115 its output is" and insert -- 115 is --.
Line 56, delete "output (O)" and insert -- output (Q) --.

Column 6,
Line 60, delete "inverting P12" and insert -- inverting P2 --.

Column 9,
Line 58, delete "CLKINMAQXFREQ" and insert -- CLKINMAXFREQ --.

Column 10,
Line 59, delete "FIGS" and insert -- FIG --.
Lines 60 and 64, delete "166" and insert -- I66 --.

Column 11,
Line 22, delete "Buffer 166" and insert -- Buffer I66 --.
Line 25, delete "buffer 166" and insert -- buffer I66 --.

Column 12,
Line 20, delete "off PFET T7 off" and insert -- off PFET T7 --.
Line 37, delete "a schematic a schematic" and insert -- a schematic --.
After line 60, insert the following two paragraphs:
-- In Fig. 9, 2 divider 110 also includes a first inverting multiplexer 345A and a second inverting multiplexer 345B. The select input of inverting multiplexer 345A (345B) is coupled to RESET2, a first input of the inverting multiplexer is coupled to ground (VCC) and a second input of the inverting multiplexer is coupled to CLKINB (CLKIN). When RESET2 is high, the output of inverting multiplexer 345A is high (VCC) and the output of inverting multiplexer 345B is low (ground). When RESET2 is low, the output of inverting multiplexer 345A (345B) is inverted CLKINB (inverted CLKIN). The output of inverting multiplexer 345A is coupled to the gate of PFETs T16 and T19 and and NFET T25 (node P22). The output of inverting multiplexer 345B is coupled to the gate of NFETs T21 and T18 and PFET T26 (node P23). The drain of PFET T26 and the source of NFET T25 are coupled to node P21. The source of PFET T26 and the drain of

UNITED STATES PATENT AND TRADEMARK OFFICE
CERTIFICATE OF CORRECTION

PATENT NO. : 6,917,662 B2
DATED : July 12, 2005
INVENTOR(S) : Austin et al.

It is certified that error appears in the above-identified patent and that said Letters Patent is hereby corrected as shown below:

Column 12 (cont'd),
NFET T25 are coupled together to form a node P24 hence forming a transmission gate. The gates of PFETs T15 and T20 and NFETs T17 and T22 are coupled to node P24. The 2 divider 110 is completed by a pull down NFET T25, the drain of NFET T27 coupled to node P21, the source of NFET T27 coupled to ground, and the gate of NFET T27 coupled to RESET2. When RESET2 is high, NFET T27 is on and node P21 is pulled low. With node P21 low, CLKOUT2 is high and no division occurs.
In operation, when RESET2 is high, node P21 transitions to 0, node P22 transitions to 1 and node P23 transitions to 0, PFETs T16 and T20 and NFETs T18 and T22 are off, nodes P18 and P19 hang, NFET T25 and PFET T26 are on and P21=P24=0. When RESET2 transitions to 0 and if CLKIN=1 and CLKINB=0 then node P22=1, node P23=0, PFETs T16 and T20 and NFETs T18 and T22 are off, nodes P18 and P19 hang, NFET T 25 and PFET T26 are on and P21=P24=0. The 2 divider 110 is essentially a divide by 2 state machine for states which transition in the following order. --.

Column 13,
Line 14, delete "*B*24=1" and insert -- P24=1 --.

Column 14,
Line 16, delete "a output" and insert -- an output --.
Line 44, delete "geneating" and insert -- generating --.
Lines 65-67, delete "coupling one said output clock signal of one said frequency divider to a clock output of said programmable divider" and insert -- coupling said output clock signal of one of said frequency dividers to a clock output of said programmable frequency dividers --.

UNITED STATES PATENT AND TRADEMARK OFFICE
CERTIFICATE OF CORRECTION

PATENT NO. : 6,917,662 B2
DATED : July 12, 2005
INVENTOR(S) : Austin et al.

It is certified that error appears in the above-identified patent and that said Letters Patent is hereby corrected as shown below:

Column 15,
Line 5, delete "output said" and insert -- output of said --.
Line 30, delete "frquency" and insert -- frequency --.

Signed and Sealed this

Twenty-second Day of November, 2005

JON W. DUDAS
*Director of the United States Patent and Trademark Office*